United States Patent
Basceri et al.

(10) Patent No.: US 6,881,642 B2
(45) Date of Patent: Apr. 19, 2005

(54) METHOD OF FORMING A MIM CAPACITOR WITH METAL NITRIDE ELECTRODE

(75) Inventors: Cem Basceri, Boise, ID (US); Thomas M. Graettinger, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/419,191

(22) Filed: Apr. 21, 2003

(65) Prior Publication Data

US 2003/0205729 A1 Nov. 6, 2003

Related U.S. Application Data

(62) Division of application No. 10/093,470, filed on Mar. 11, 2002, now Pat. No. 6,753,618.

(51) Int. Cl.[7] .............................................. H01L 21/20
(52) U.S. Cl. ...................... 438/386; 438/243; 438/396; 438/398; 257/296; 257/298
(58) Field of Search ................................. 438/386, 243, 438/396, 398, 244, 250, 257, 253, 379, 387, 399, 683, 685, 238, 393, 686, 267, 771; 257/915, 296, 298, 300–308

(56) References Cited

U.S. PATENT DOCUMENTS

| | | | |
|---|---|---|---|
| 5,566,045 A | | 10/1996 | Summerfelt et al. |
| 5,851,680 A | | 12/1998 | Heau |
| 5,866,205 A | | 2/1999 | Vaartstra et al. |
| 6,010,931 A | * | 1/2000 | Sun et al. .................... 438/240 |
| 6,057,571 A | | 5/2000 | Miller et al. |
| 6,103,567 A | | 8/2000 | Shih et al. |
| 6,144,060 A | | 11/2000 | Park et al. |
| 6,153,490 A | * | 11/2000 | Xing et al. .................. 438/396 |
| 6,159,793 A | | 12/2000 | Lou |
| 6,177,305 B1 | | 1/2001 | Hornback et al. |
| 6,229,211 B1 | | 5/2001 | Kawanoue et al. |
| 6,255,187 B1 | * | 7/2001 | Horii .......................... 438/396 |
| 6,258,664 B1 | | 7/2001 | Reinberg |
| 6,281,142 B1 | | 8/2001 | Basceri et al. |
| 6,291,342 B1 | | 9/2001 | Lee et al. |
| 6,338,880 B1 | | 1/2002 | Akram |
| 6,376,328 B1 | * | 4/2002 | Aiso et al. .................. 438/398 |

(Continued)

FOREIGN PATENT DOCUMENTS

WO WO 02/31873 A1 4/2002

OTHER PUBLICATIONS

Clark–Phelps RB et al: "Engineered tantalum aluminate and hafnium aluminate ALD films for ultrathin dielectric films with improved electrical and thermal properties," Mat. Res. Soc. Symp. Proc., vol. 670, Apr. 17, 2001, pp. K2.2.1–K2.2.6, XP008008101, Pittsburg, PA, US.

Min JS et al: "Atomic Layer Deposition of TiN Films by Alternate Supply of Tetrakis(ethylmethylamino)–Titanium and Ammonia," Jpn. J. Appl. Phys., vol. 37, Sep. 1998, pp. 4999–5004, XP000974439, Tokyo, Japan.

*Primary Examiner*—David Nelms
*Assistant Examiner*—Long Tran
(74) *Attorney, Agent, or Firm*—Dickstein Shapiro Morin & Oshinsky LLP

(57) ABSTRACT

A method of forming an MIM capacitor with low leakage and high capacitance is disclosed. A layer of titanium nitride (TiN) or boron-doped titanium nitride (TiBN) material is formed as a lower electrode over an optional capacitance layer of hemispherical grained polysilicon (HSG). Prior to the dielectric formation, the first layer may be optionally subjected to a nitridization or oxidation process. A dielectric layer of, for example, aluminum oxide ($Al_2O_3$) formed by atomic layer deposition (ALD) is fabricated over the first layer and after the optional nitridization or oxidation process. An upper electrode of titanium nitride (TiN) or boron-doped titanium nitride (TiBN) is formed over the dielectric layer.

55 Claims, 11 Drawing Sheets

U.S. PATENT DOCUMENTS

| | | |
|---|---|---|
| 6,495,877 B1 | 12/2002 | Hsue et al. |
| 6,580,111 B1 * | 6/2003 | Kim et al. .................. 257/301 |
| 2001/0024387 A1 * | 9/2001 | Raaijmakers et al. ....... 365/200 |
| 2001/0036708 A1 | 11/2001 | Shin et al. |
| 2002/0014647 A1 * | 2/2002 | Seidl et al. .................. 257/301 |
| 2002/0195683 A1 * | 12/2002 | Kim et al. .................. 257/532 |
| 2003/0049931 A1 * | 3/2003 | Byun et al. .................. 438/649 |
| 2003/0096473 A1 * | 5/2003 | Shih et al. .................. 438/240 |

* cited by examiner

METHOD OF FORMING A MIM CAPACITOR WITH METAL NITRIDE ELECTRODE

CROSS REFERENCE TO RELATED APPLICATIONS

The present application is a divisional application U.S. patent application Ser. No. 10/093,470, filed on Mar. 11, 2002 now U.S. Pat. No. 6,753,618, the disclosure of which is incorporated by reference herein.

FIELD OF THE INVENTION

The present invention relates to the field of integrated circuits and, in particular, to a novel method of forming capacitor structures.

BACKGROUND OF THE INVENTION

A dynamic random access memory (DRAM) cell typically comprises a charge storage capacitor coupled to an access device such as a Metal-Oxide-Semiconductor Field Effect Transistor (MOSFET). The MOSFET functions to apply or remove charge on the capacitor, thus affecting a logical state defined by the stored charge. The amount of charge stored on the capacitor is determined by the capacitance $C = \in \in_o A/d$, where $\in$ is the dielectric constant of the capacitor dielectric, $\in_o$ is the vacuum permittivity, A is the electrode (or storage node) area, and d is the interelectrode spacing. The conditions of DRAM operation, such as operating voltage, leakage rate and refresh rate, will in general mandate that a certain minimum charge be stored by the capacitor.

In the continuing trend to higher memory capacity, the packing density of storage cells must increase, yet each must maintain required capacitance levels. This is a crucial demand of DRAM fabrication technologies if future generations of expanded memory array devices are to be successfully manufactured. Nevertheless, in the trend to higher memory capacity, the packing density of cell capacitors has increased at the expense of available cell area. For example, the area allowed for a single cell in a 64-Mbit DRAM is only about 1.4 $\mu m^2$. In such limited areas, it is difficult to provide sufficient capacitance using conventional stacked capacitor structures. Yet, design and operational parameters determine the minimum charge required for reliable operation of the memory cell despite decreasing cell area.

Several techniques have been developed to increase the total charge capacity or the capacitance of the cell capacitor without significantly affecting the cell area. For example, new capacitor dielectric materials with high dielectric constants have been introduced to replace conventional dielectric materials such as silicon nitride. This way, thin films of materials having a high dielectric constant, such as $Ta_2O_5$ (tantalum pentoxide), Barium Titanate (BT), Strontium Titanate (ST), Lead Zirconium Titanate (PZT), or Bismuth Strontium Titanate (BST), have been increasingly utilized as the cell dielectric material of choice of DRAMs.

Although these materials have a high dielectric constant, typically greater than 300, and low leakage currents, there are some technical difficulties associated with these materials. One problem with incorporating these materials into current DRAM cell designs is their chemical reactivity with the polycrystalline silicon (polysilicon or "poly") that conventionally forms the capacitor electrode. Capacitors made of polysilicon-PZT/BST sandwiches undergo chemical and physical degradation with thermal processing. During the chemical vapor deposition (CVD) of PZT/BST, oxygen in the ambient tends to oxidize the electrode material. The oxide is undesirable because it has a much lower dielectric constant compared to that of PZT/BST, and adds in series to the capacitance of the PZT/BST, thus drastically lowering the total capacitance of the capacitor. Thus, even a thin native oxide layer present on the electrode results in a large degradation in capacitance.

Another attempt at increasing the cell capacitance has been introducing noble metals, such as platinum, iridium, ruthenium, or gold, as lower electrodes for metal-insulator-metal (MIM) capacitors. Unfortunately, these metals have poor conformal properties and poor step coverage. In addition, these noble metals, particularly platinum, have a high reactivity to silicon. Thus, when elements of the platinum group and their oxides are used as electrode materials, unwanted diffusion and reactions are likely to occur between the electrode Material and the material of the underlying conductive plug, which is typically polysilicon. Accordingly, a barrier layer is typically employed between the conductive plug and the lower capacitor electrode.

Capacitor electrodes having textured surface morphology have been also introduced to increase the interfacial area between the dielectric thin film and the adjacent electrode and, therefore, to increase the capacitance. For example, in conventional metal-insulator-polysilicon (MIS) capacitors, hemispherical grain polysilicon (HSG) has been introduced as the material of choice for the lower electrode because the increased surface area of the HSG electrode and of its respective interfacial area is directly proportional to the cell capacitance. However, for a metal-insulator-metal (MIM) capacitor, current technologies make it difficult to confer to a metal film the desired textured surface morphology and shape which is characteristic to a hemispherical grain polysilicon electrode.

Accordingly, there is a need for a method of forming an MIM capacitor having increased capacitance per cell and low leakage, as well as a method of forming a capacitor structure that achieves high storage capacitance without increasing the size of the capacitor.

BRIEF SUMMARY OF THE INVENTION

The present invention provides an MIM capacitor with metal nitride electrodes as well as a method of forming an MIM capacitor with low leakage and high capacitance.

The MIM capacitor with metal nitride electrodes of the present invention comprises a first layer of metal nitride formed as part of a lower electrode over an optional conductive support layer of hemispherical grained polysilicon (HSG). The first metal nitride layer may be a titanium nitride (TiN) layer or a TiBN (boron-doped titanium nitride) layer. Prior to the dielectric formation, the first metal nitride layer may be optionally nitridized or oxidized. A dielectric layer of aluminum oxide ($Al_2O_3$), for example, is fabricated over the metal nitride layer. An upper electrode of a second metal nitride layer is formed over the dielectric layer. The second metal nitride layer may be a titanium nitride (TiN) layer or a boron-doped titanium nitride (TiBN) layer.

The present invention also provides a method of forming an MIM capacitor with reduced leakage current and high capacitance. A first layer of metal nitride is formed as part of a lower electrode over an optional conductive support layer of hemispherical grained polysilicon (HSG). The first metal nitride layer may be a titanium nitride (TiN) layer or a TiBN (boron-doped titanium nitride) layer. If titanium nitride (TiN) is employed, the titanium nitride (TiN) layer may be formed by either a deposition technique, for example chemical vapor deposition (CVD), or by atomic layer deposition (ALD). If boron-doped titanium nitride (TiBN) is employed, the boron-doped titanium nitride (TiBN) layer may be formed by a deposition method, for example chemical vapor deposition (CVD). After its formation and prior to the dielectric formation, the first metal nitride layer may be optionally subjected to a nitridization or oxidation process.

A dielectric layer is fabricated over the metal nitride layer and after the optional nitridization or oxidation process. The dielectric layer may be formed by either a deposition technique, for example chemical vapor deposition (CVD), or by an atomic layer deposition (ALD) method.

An upper electrode of a second metal nitride layer is formed over the dielectric layer. The second metal nitride layer may be a titanium nitride (TiN) layer or a boron-doped titanium nitride (TiBN) layer. If titanium nitride (TiN) is employed, the titanium nitride (TiN) layer may be formed by either a deposition technique, for example chemical vapor deposition (CVD), or by atomic layer deposition (ALD). If boron-doped titanium nitride (TiBN) is employed, the boron-doped titanium nitride (TiBN) layer may be formed by a deposition method, for example chemical vapor deposition (CVD).

The foregoing and other advantages and features of the invention will be better understood from the following detailed description of the invention, which is provided in connection with the accompanying drawings.

DETAILED DESCRIPTION OF THE INVENTION

In the following detailed description, reference is made to various specific embodiments in which the invention may be practiced. These embodiments are described with sufficient detail to enable those skilled in the art to practice the invention, and it is to be understood that other embodiments may be employed, and that structural, logical, and electrical changes may be made.

The term "substrate" used in the following description may include any semiconductor-based structure that has a silicon surface. Structure must be understood to include silicon, silicon-on insulator (SOI), silicon-on sapphire (SOS), doped and undoped semiconductors, epitaxial layers of silicon supported by a base semiconductor foundation, and other semiconductor structures. The semiconductor also need not be silicon-based. The semiconductor could be silicon-germanium, germanium, or gallium arsenide. When reference is made to a substrate in the following description, previous process steps may have been utilized to form regions or junctions in or on the base semiconductor or foundation.

The term "titanium" is intended to include not only elemental titanium, but titanium with other trace metals or in various alloyed combinations with other metals as known in the semiconductor art, as long as such titanium alloy retains the physical and chemical properties of titanium.

Figure 1:
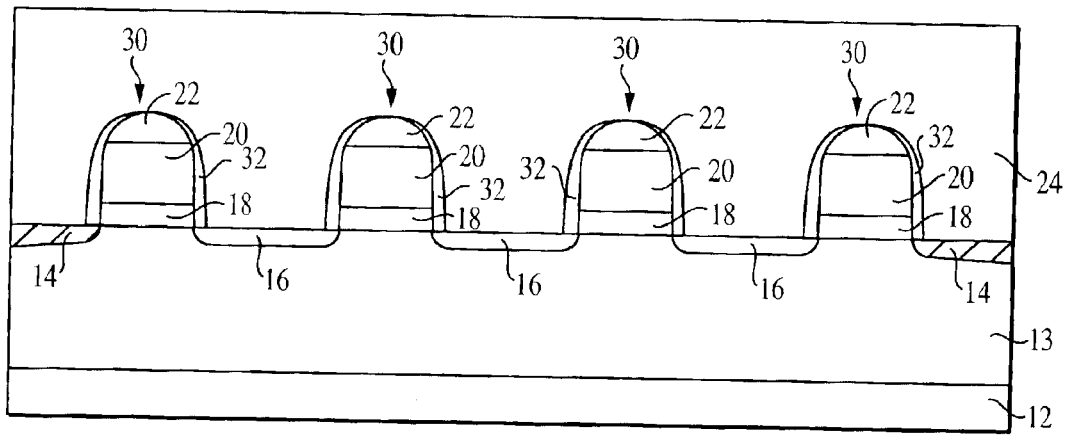
FIG. 1 is a schematic cross-sectional view of a portion of a memory DRAM device, in which an MIM capacitor will be fabricated according to a method of the present invention.

Referring now to the drawings, where like elements are designated by like reference numerals, FIG. 1 depicts a memory cell construction for a DRAM at an intermediate stage of the fabrication, in which a pair of memory cells having respective access transistors are formed on a substrate 12. The FIG. 1 structure includes the substrate 12 having a well 13, which is typically doped to a predetermined conductivity, for example p-type or n-type depending on whether NMOS or PMOS transistors will be formed therein. The structure further includes field oxide regions 14, conventional doped active areas 16 for use as source/drain regions, and a pair of gate stacks 30, all formed according to well-known semiconductor processing techniques. The gate stacks 30 include a gate oxide layer 18, a conductive gate layer 20, such as polysilicon or polysilicon covered by a silicide, nitride spacers 32 and a nitride cap 22.

Above the gate oxide region 18, the polysilicon gates 20, and the protective nitride regions 22, 32, a first insulating layer 24 (FIG. 1) is disposed. Insulating layer 24 could be formed of silicon oxide, borophosphosilicate glass (BPSG), borosilicate glass (BSG), or phosphosilicate glass (PSG), among others.

Figure 2:
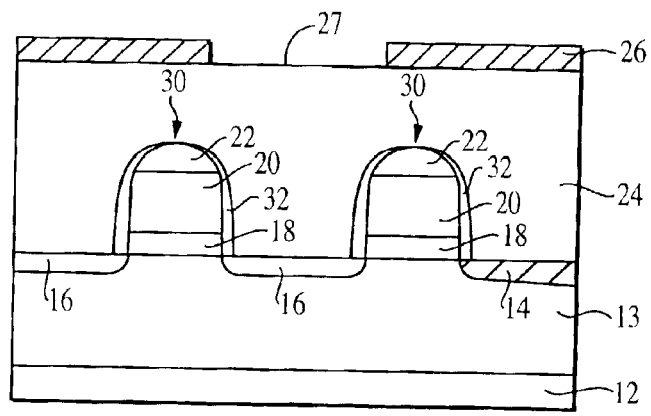
FIG. 2 is a schematic cross-sectional view of the FIG. 1 device at a stage of processing subsequent to that shown in FIG. 1.
Figure 3:
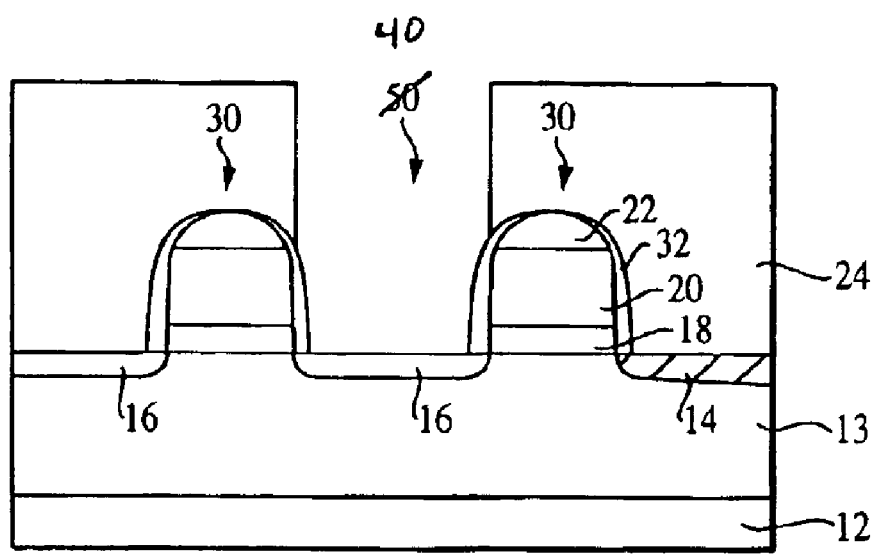
FIG. 3 is a schematic cross-sectional view of the FIG. 1 device at a stage of processing subsequent to that shown in FIG. 2.

Reference is now made to FIG. 2, which for simplicity illustrates only a lateral portion, for example, the right side portion of FIG. 1. This is a region where a contact plug and an overlying MIM capacitor structure 100 (FIG. 16) fabricated according to exemplary embodiments of the present invention will be formed. To create a contact opening 40 (FIG. 3) into the substrate 12 through the first insulating layer 24, a photoresist material 26 (FIG. 2) is deposited and patterned using conventional photolithography steps. After patterning, an initial opening 27 (FIG. 2) is formed in the photoresist layer 26 for subsequent oxide etching. The first insulating layer 24 of FIG. 2 is then etched, to form a contact opening 40, and the photoresist layer 26 is removed, as shown in FIG. 3. The contact opening 40 extends to the source/drain region 16 provided in the well 13 of the substrate 12.

Figure 4:
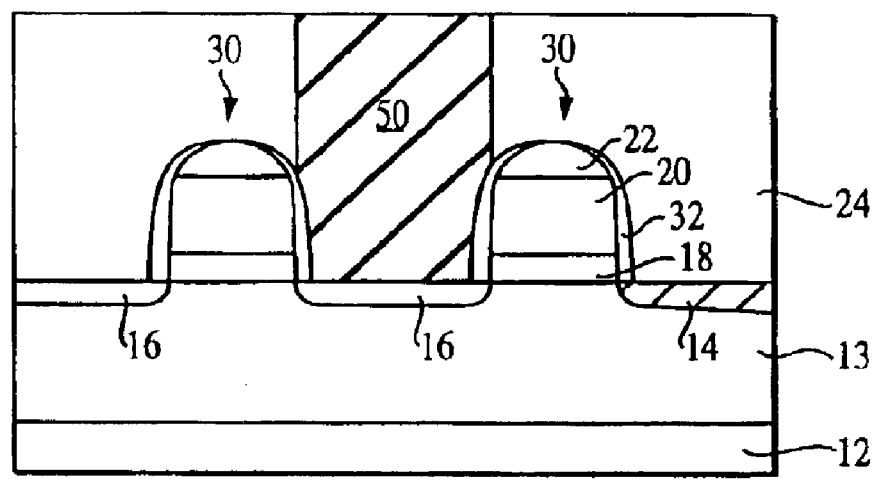
FIG. 4 is a schematic cross-sectional view of the FIG. 1 device at a stage of processing subsequent to that shown in FIG. 3.
Figure 5:
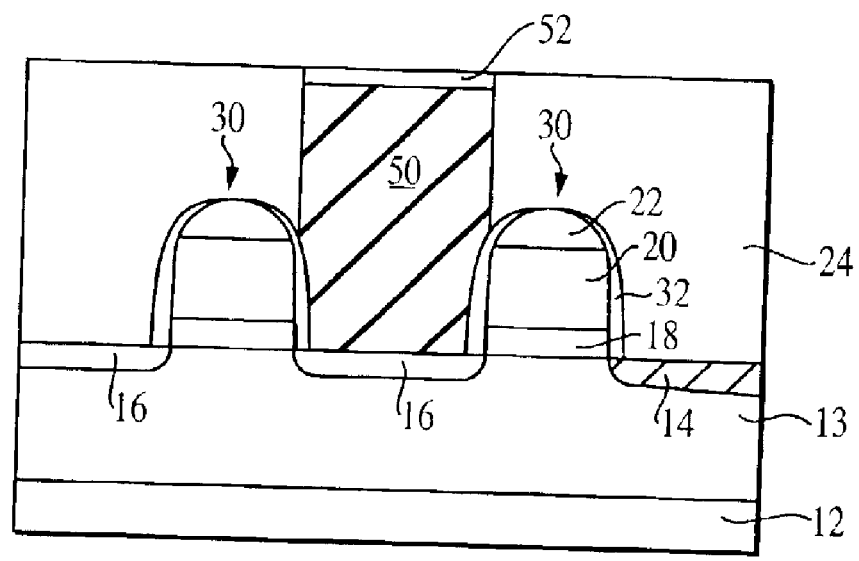
FIG. 5 is a schematic cross-sectional view of the FIG. 1 device at a stage of processing subsequent to that shown in FIG. 4.

Next, contact opening 40 (FIG. 3) is filled with a conductive material, such as doped polysilicon, that is planarized down to or near the planar surface of the first insulating layer 24, to form a polysilicon plug or filler 50, as illustrated in FIG. 4. The polysilicon plug 50 is then anisotropically etched until its top surface is recessed below the planar surface of the first insulating layer 24, so that a barrier layer 52 (FIG. 5) can be deposited and planarized, as shown in FIG. 5. The barrier layer 52, preferably of titanium (Ti), is formed on the polysilicon plug 50 by CVD, PVD, sputtering or evaporation, to a thickness of about 60 to about 200 Angstroms. The titanium barrier layer 52 will form titanium silicide ($TiSi_2$) during a later high temperature anneal.

Although the present invention is described with reference to the formation of an MIM capacitor 100 (FIG. 16) over the polysilicon plug 50, including the barrier layer 52, it must be understood that the existence of the barrier layer 52 is optional, and that the present invention also applies to capacitors formed over polysilicon plugs without protective barrier layer 52.

Figure 6:
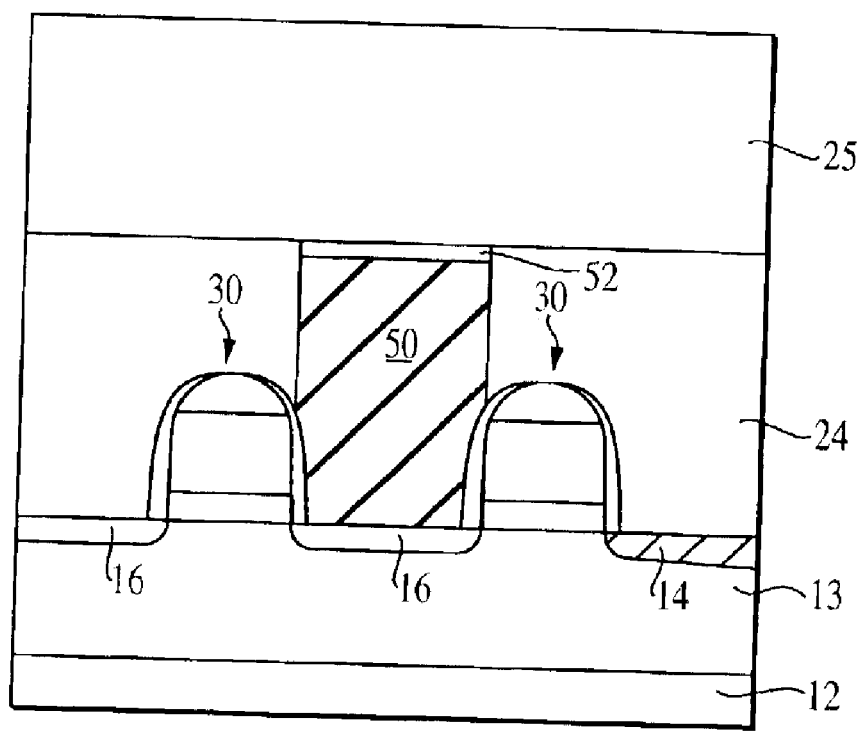
FIG. 6 is a schematic cross-sectional view of the FIG. 1 device at a stage of processing subsequent to that shown in FIG. 5.

FIG. 6 illustrates the deposition of a second insulating layer 25, which could be, for example, a silicon oxide, borophosphosilicate glass (BPSG), borosilicate glass (BSG), phosphosilicate glass (PSG), or tetraethylortho silicate (TEOS). The second insulating layer 25 is deposited over the barrier layer 52 and the first insulating layer 24. Again, using the same fabrication technique as that used for the formation of contact opening 40 (FIG. 3) through the first insulating layer 24, a capacitor opening 41 (FIG. 7) is formed through the second insulating layer 25.

Figure 7:
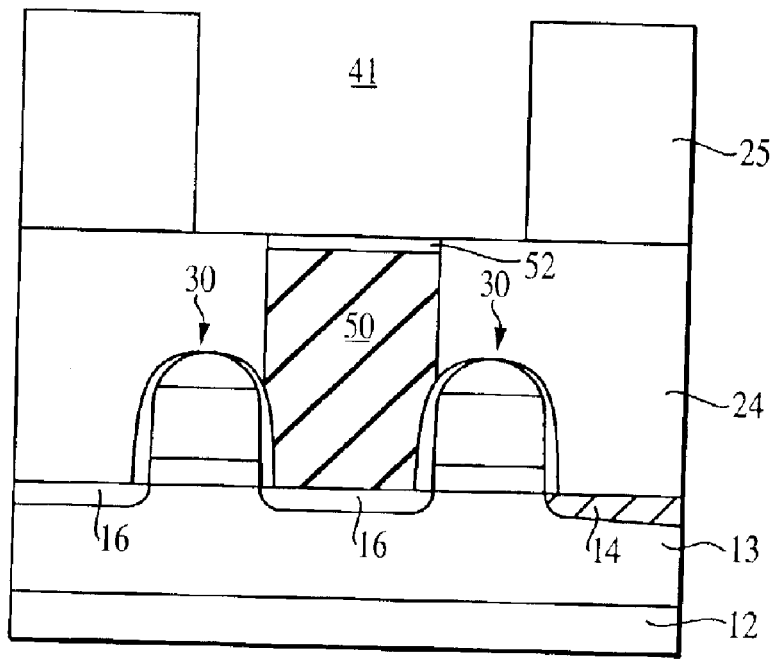
FIG. 7 is a schematic cross-sectional view of the FIG. 1 device at a stage of processing subsequent to that shown in FIG. 6.
Figure 8:
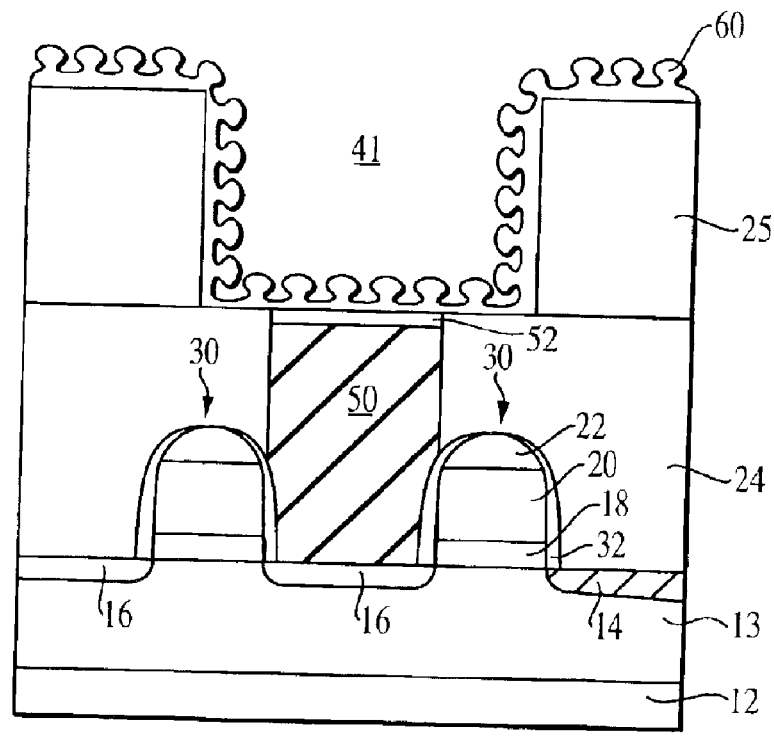
FIG. 8 is a schematic cross-sectional view of the FIG. 1 device at a stage of processing subsequent to that shown in FIG. 7.

Subsequent to the formation of capacitor opening 41 of FIG. 7, a conductive support layer 60 is optionally formed inside the capacitor opening 41 and over the upper surface of the insulating layer 25, as illustrated in FIG. 8. The conductive support layer 60 may be formed of hemispherical grained polysilicon (HSG), silica, silicon, germanium, or any alloy of silica or germanium to increase capacitance. Preferably, the conductive support layer 60 is formed of hemispherical grained polysilicon (HSG). If HSG is used, the conductive support layer 60 may be formed by first depositing a layer of in-situ doped polysilicon followed by a deposition of undoped HSG. Subsequent heating inherent in wafer processing could effectively conductively dope the overlying HSG layer. Alternatively, the conductive support layer 60 may be provided by in-situ arsenic doping of an entire HSG layer, or the conductive support layer 60 may be formed by depositing amorphous silicon and then using a selective seed followed by an annealing process. The conductive support layer 60 is in electrical contact with the previously formed conductive plug 50 over the active area 16.

Figure 9:
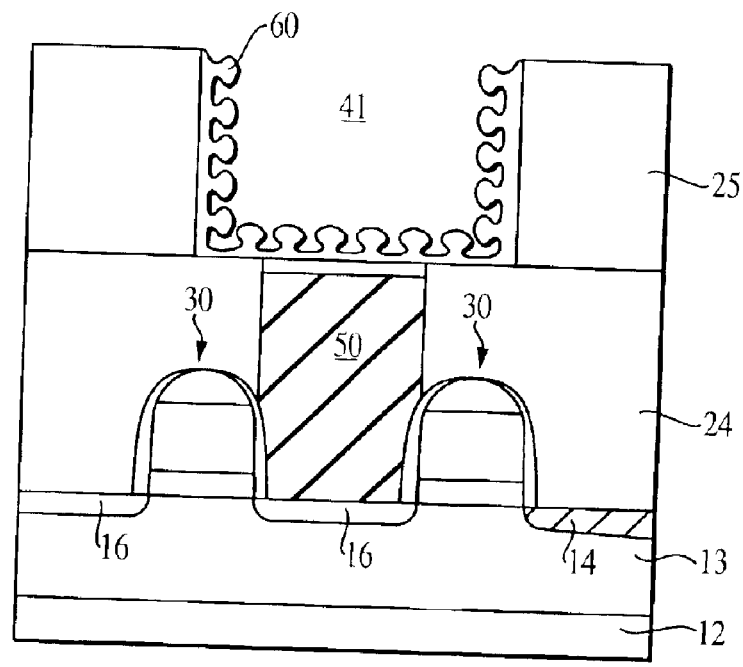
FIG. 9 is a schematic cross-sectional view of the FIG. 1 device at a stage of processing subsequent to that shown in FIG. 8.

Referring now to FIG. 9, portions of the conductive support layer 60 above the top surface of the second insulating layer 25 are removed through a CMP or etching process, thereby electrically isolating the portions of the conductive support layer 60 remaining inside the capacitor opening 41.

Figure 10:
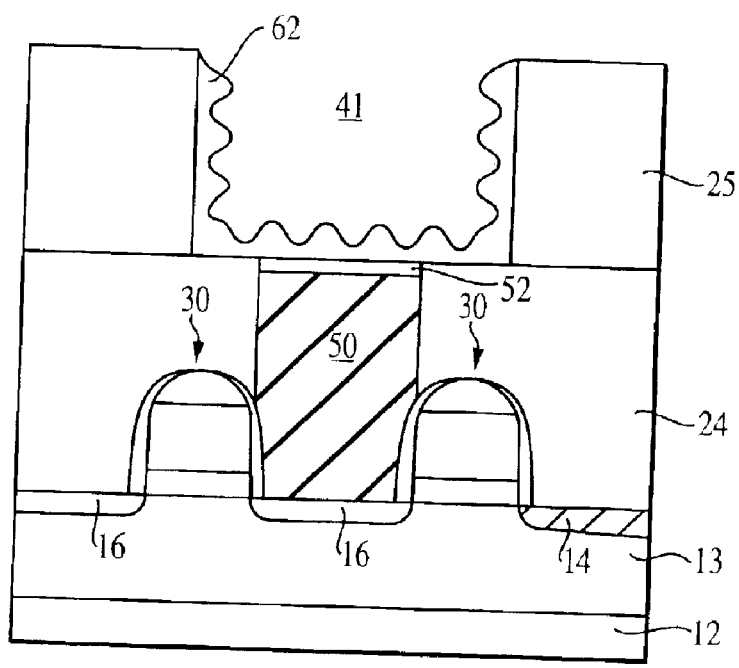
FIG. 10 is a schematic cross-sectional view of the FIG. 1 device at a stage of processing subsequent to that shown in FIG. 9.

According to an embodiment of the present invention, if the conductive support layer 60 is formed of HSG, the conductive support layer 60 may be further subjected to an etching solution, for example, a dilute solution of hydrofluoric acid (HF) with a 10:1 volumetric ratio of water to 49% HF, to form an etched conductive support layer 62, as illustrated in FIG. 10. The etching solution removes any native oxide formed over the conductive support layer 60 and further enlarges the openings of the HSG and activates the HSG grains of the conductive support layer 60. This way, the etched conductive support layer 62 with activated HSG grains allows the subsequently deposited metal electrode to achieve good conformal properties with the etched conductive support HSG layer 62 and better step coverage.

According to yet another embodiment of the present invention, the etched conductive support layer 62 (FIG. 11) may be optionally subjected to a high temperature rapid thermal nitridation (RTN) process to further increase the stack capacitance and decrease the leakage. The high temperature rapid thermal nitridization (RTN) process may take place at temperatures ranging from about 600° C. to about 1200° C., more preferably between about 800° C. to about 1000° C., for a time period ranging from about 5 seconds to about 60 seconds, preferably from about 20 seconds to about 60 seconds. Alternatively, the etched conductive support layer 62 may be subjected to a $PH_3$ anneal, or to an $N_2$ or ammonia ($NH_3$) plasma processing or other nitrogen source plasma processing to confer a good interface between the etched conductive support layer 62 and the subsequently formed metal electrode layer.

Figure 11:
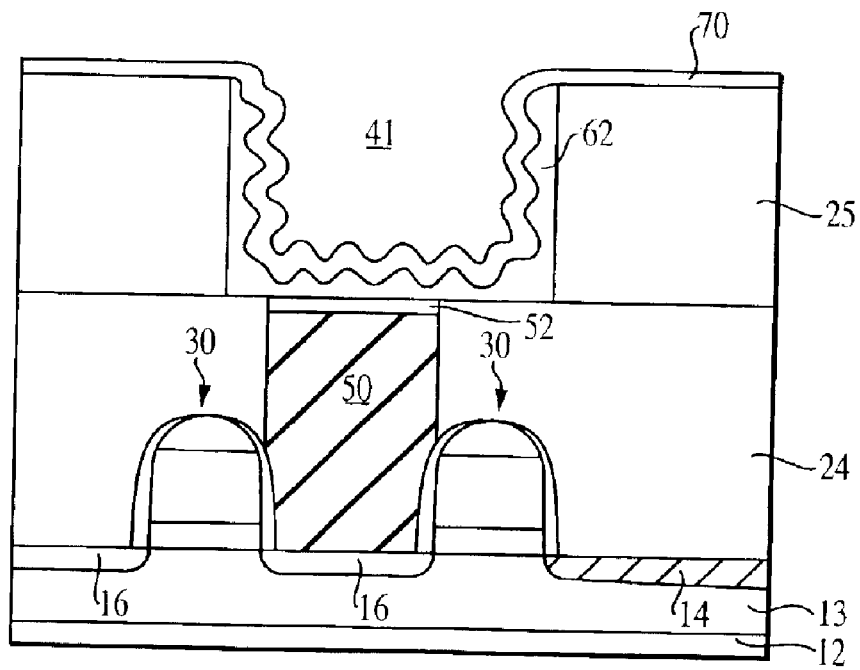
FIG. 11 is a schematic cross-sectional view of the FIG. 1 device at a stage of processing subsequent to that shown in FIG. 10.

Referring now to FIG. 11, a first metal nitride layer 70 is deposited over the etched conductive support layer 62 and the upper surface of the second insulating layer 25 to form a lower capacitor electrode 70. The first metal nitride layer 70 is formed to a thickness of about 25 Angstroms to about 1,000 Angstroms, more preferably of about 50 Angstroms to about 250 Angstroms.

According to an embodiment of the present invention, the first metal nitride layer 70 (FIG. 11) is formed of titanium nitride (TiN) material. Titanium nitride is an extremely hard material, is almost chemically inert (although it dissolves readily in hydrofluoric acid) and is an excellent conductor. Titanium nitride is also preferred because it has a high melting point (about 3000° C.), which makes it unaffected by high processing temperatures and by most reagents, and because it makes excellent ohmic contact with other conductive layers.

According to an exemplary embodiment of the present invention, the titanium nitride layer 70 may be formed by a deposition method, for example, a chemical vapor deposition (CVD) process using a metal source and a nitrogen source as precursors, at a temperature of about 500° C. to about 800° C., more preferably of about 600° C. This way, the titanium nitride layer 70 may be formed using a nitrogen source, such as an ammonia (NH$_3$) source, and a titanium source precursor containing chlorine (Cl), such as TiCl$_4$ (titanium tetrachloride), TiCl$_3$ (titanium trichloride), (C$_5$H$_5$)$_2$TiCl$_2$ [bis(cyclopentadienyl)titanium dichloride] or (C$_5$H$_5$)TiCl$_3$ (cyclopentadienyltitanium trichloride), among others. Alternatively, the titanium nitride layer 70 may be formed by a low-temperature chemical vapor deposition (CVD) process by adding (CH$_3$)HNNH$_2$ (methylhydrazine) to a titanium source containing chlorine (Cl), for example TiCl$_4$ (titanium tetrachloride). A metalorganic precursor such as TiN[CH$_2$(CH$_3$)$_2$]$_4$ (tetrakis diethylamino titanium or TDEAT) or Ti[N(CH$_3$)$_2$]$_4$ (tetrakis dimethylamino titanium or TDMAT) may be also used with a nitrogen source precursor to form the titanium nitride layer 70 of FIG. 11.

According to yet another embodiment of the present invention, the titanium nitride layer 70 (FIG. 11) may be formed by an atomic layer deposition (ALD) process. According to this embodiment, a first species of precursor, which may be a titanium source precursor containing chlorine (Cl), such as TiCl$_4$ (titanium tetrachloride) or TiCl$_3$ (titanium trichloride) for example, is first deposited over the surface of the etched conductive support layer 62 (FIG. 10) as a first monolayer. A second species of precursor, which may be an ammonia (NH$_3$) source, for example, is next applied over the monolayer of the first species of precursor. The second species of precursor reacts with the monolayer of the first species of precursor to form a titanium nitride (TiN) layer. Each of the TiN layers of the first and second species of precursors are provided on the surface of the etched conductive support layer 62 by first pulsing the first species (also called first precursor gas) and then the second species (also called second precursor gas) into the region of the surface of the etched conductive support layer 62. The sequence of depositing the monolayers of the first and second species of precursors can be repeated cycle after cycle and as often as needed, until a desired thickness is reached for the titanium nitride (TiN) layer 70. Between each of the precursor gas pulses, the process region is exhausted and a pulse of purge gas is injected. The thickness of the titanium nitride layer 70 formed by the ALD process outlined above is in the range of about 25 Angstroms to about 250 Angstroms, more preferably of about 25 Angstroms to about 100 Angstroms.

According to another embodiment of the present invention, the first metal nitride layer 70 is formed of boron-doped titanium nitride (TiBN) material having a boron doping concentration of from about 0.01% to about 30% (atomic percentage). Incorporation of boron into a titanium nitride (TiN) film may be achieved by exposing a formed titanium nitride film to B$_2$H$_6$ at a temperature of from about 200° C. to about 600° C., at a pressure of from about 1 Torr to about 1000 Torr, and for a period of time of about 10 seconds to about 60 minutes to convert the titanium nitride film to the boron-doped titanium nitride layer 70 (FIG. 11). Alternatively, the incorporation of boron into a titanium nitride (TiN) film may be achieved by exposing the titanium nitride film to B$_2$H$_6$ and further to ultraviolet (UV) light, at a temperature of from about 200° C. to about 600° C., at a pressure of from about 1 Torr to about 1000 Torr, and for a period of time of about 10 seconds to about 60 minutes. Any wavelength in the ultraviolet range may be used for exposing the B$_2$H$_6$ and further incorporating the boron into the titanium nitride material.

According to yet another embodiment of the present invention, the boron-doped titanium nitride layer 70 may be also formed by a deposition method, for example, a chemical vapor deposition (CVD) process using a titanium source, a boron source, and a nitrogen source as precursors, at a temperature of about 500° C. to about 800° C., more preferably of about 600° C. This way, the boron-doped titanium nitride layer 70 may be formed using a titanium source precursor containing chlorine (Cl), such as for example TiCl$_4$ (titanium tetrachloride), TiCl$_3$ (titanium trichloride), (C$_5$H$_5$)$_2$TiCl$_2$ [bis(cyclopentadienyl)titanium dichloride] or (C$_5$H$_5$)TiCl$_3$ (cyclopentadienyltitanium trichloride), a boron source such as B$_2$H$_6$, and a nitrogen source, such as an ammonia (NH$_3$) source.

Subsequent to the formation of the first metal nitride layer 70 (FIG. 11), the first metal nitride layer 70 is subjected to an oxidizing or a nitridizing ambient to densify the titanium nitride or the boron-doped titanium nitride material of the first metal nitride layer 70 and, therefore, to decrease the leakage and increase the cell capacitance. The oxidizing or nitridizing ambient also prevents the unwanted diffusion and reactions between the electrode 70 and the material of the underlying etched conductive support layer 62, as well as chlorine (Cl) permeation in the first metal nitride layer 70. The presence of chlorine atoms in the titanium nitride layer typically occurs as a result of the reaction products and materials employed in the chemical vapor deposition processes for the formation of the titanium nitride layer, for example, from the metal source precursor containing chlorine (Cl), such as TiCl$_4$ (titanium tetrachloride) or TiCl$_3$ (titanium trichloride).

As such, the first metal nitride layer 70 may be subjected to a nitridizing ambient, for example, a high temperature rapid thermal nitridation (RTN) process, a remote plasma nitridization (RPN) process, or an in-situ remote RF nitridization. For this, the substrate 12 may be placed in a reaction chamber and the first metal nitride layer 70 may be subsequently exposed to a nitrogen-containing plasma formed from N$_2$ and H$_2$ within the reaction chamber. An exemplary nitrogen-containing plasma mixture comprises by volume from about 10% to about 80% of N$_2$ and from about 20% to about 90% H$_2$, at a temperature of from about 100° C. to about 800° C., more preferably of about 100° C. to about 900° C. and for about 30 seconds to about 60 seconds. The nitrogen-containing plasma mixture may further comprise argon (Ar) or another inert gas, typically in a percentage of about 0.01% to about 40% argon or inert gas, by volume. Alternatively, a nitrogen-containing plasma formed from NH$_3$ or a PH$_3$ plasma may be also employed, with or without an inert gas. In yet another embodiment of the present invention, the first metal nitride layer 70 may be subjected to an oxidizing ambient, for example, a remote plasma oxidation (RPO) ambient using an oxygen or ozone source, with or without ultraviolet light.

Figure 12:
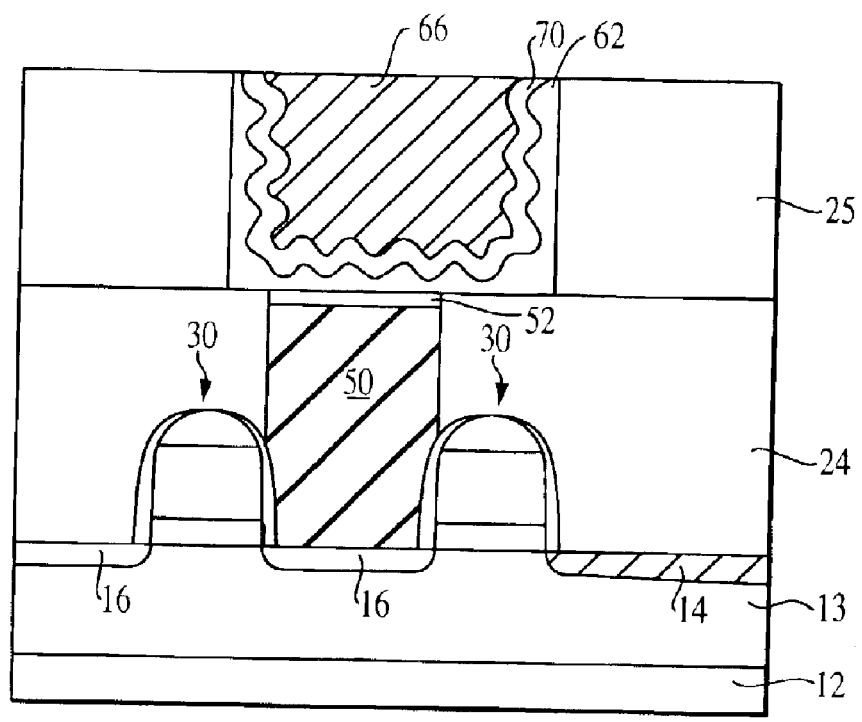
FIG. 12 is a schematic cross-sectional view of the FIG. 1 device at a stage of processing subsequent to that shown in FIG. 11.

After the exposure of the first metal nitride layer 70 to an oxidizing or a nitridizing ambient, the capacitor opening 41 (FIG. 11) is next filled with a photoresist material (not shown) by, for example, spin coating at room temperature and then solidifying it. The photoresist material, which can be any photochemical resin used in the semiconductor industry, as well as the horizontal portions of the first metal nitride layer 70 located above the second insulating layer 25, are then planarized by CMP down to or near the planar surface of the upper surface of the second insulating layer 25 to form a photoresist plug 66 (FIG. 12). The photoresist material of the plug 66 acts as a protective barrier for portions of the first metal nitride layer 70 which contact the vertical walls of the contact opening 41, as well as for the horizontal portion of the first metal nitride layer 70 which is situated above the polysilicon plug 50, during the CMP process.

Figure 13:
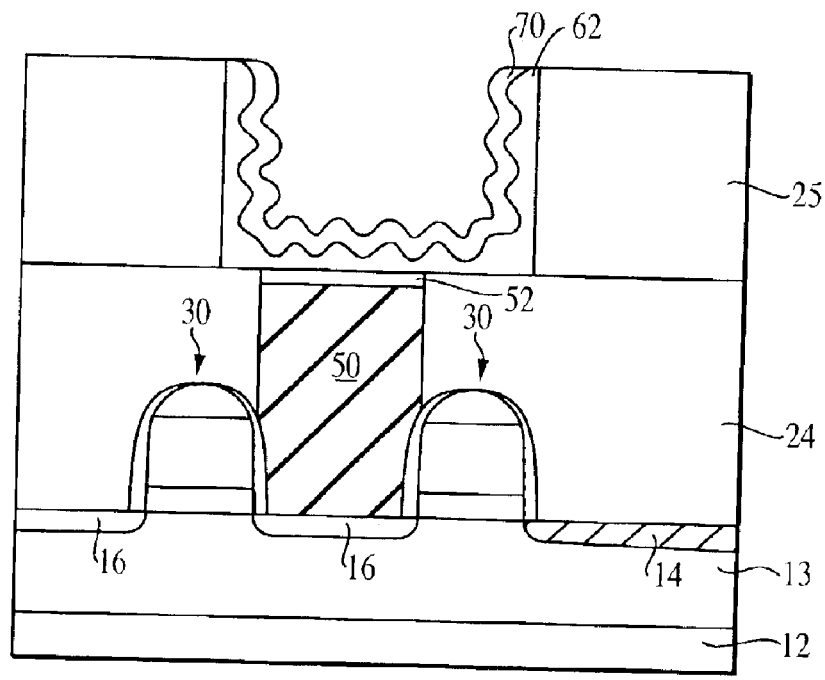
FIG. 13 is a schematic cross-sectional view of the FIG. 1 device at a stage of processing subsequent to that shown in FIG. 12.

Next, the chemically mechanically polished photoresist plug 66 (FIG. 12) is removed by using conventional techniques, such as ashing or plasma etching, to form the structure of FIG. 13. Upon removal of the photoresist plug 66, the first titanium nitride layer 70 may be optionally cleaned with a dilute etching solution, for example, a dilute solution of hydrofluoric acid (HF) having a 10:1 volumetric ratio of water to 49% HF, to remove any impurities and/or material residue present on the first titanium nitride layer 70.

Subsequent to the removal of the photoresist plug 66 and of the optional cleaning step described above, the first metal nitride layer 70 may be again subjected to an oxidizing or a nitridizing ambient to further densify the titanium nitride or the boron-doped titanium nitride material of the first metal nitride layer 70 and, therefore, to further decrease the leakage and increase the cell capacitance. Accordingly, the first metal nitride layer 70 may be subjected to a nitridizing ambient, for example, a high temperature rapid thermal nitridation (RTN) process, a remote plasma nitridization (RPN) process, or an in-situ remote RF nitridization. As explained above, the substrate 12 may be placed in a reaction chamber and the first metal nitride layer 70 may be subsequently exposed to a nitrogen-containing plasma formed from $N_2$ and $H_2$ within the reaction chamber. An exemplary nitrogen-containing plasma mixture comprises by volume from about 10% to about 80% of $N_2$ and from about 20% to about 90% $H_2$, at a temperature of from about 100° C. to about 800° C., more preferably of about 100° C. to about 900° C. and for about 30 seconds to about 60 seconds. The nitrogen-containing plasma mixture may further comprise argon (Ar) or another inert gas, typically in a percentage of about 0.01% to about 40% argon or inert gas, by volume. Alternatively, a nitrogen-containing plasma formed from $NH_3$ or a $PH_3$ plasma may be also employed, with or without an inert gas. In yet another embodiment of the present invention, the first metal nitride layer 70 may be subjected to an oxidizing ambient, for example, a remote plasma oxidation (RPO) ambient using an oxygen or ozone source, with or without ultraviolet light.

Figure 14:
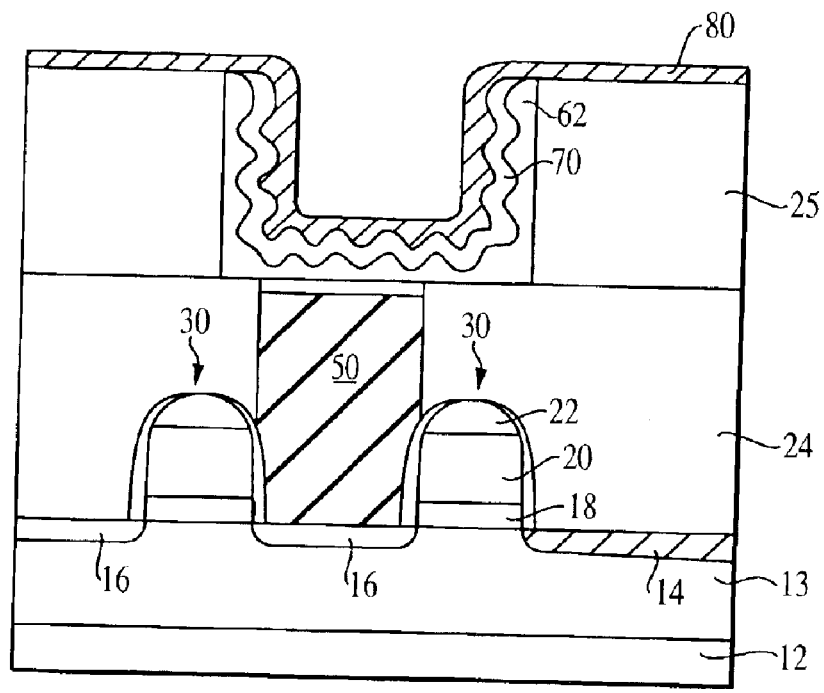
FIG. 14 is a schematic cross-sectional view of the FIG. 1 device at a stage of processing subsequent to that shown in FIG. 13.

Subsequent to the fabrication of the first metal nitride layer 70, a dielectric layer 80 is formed over the first metal nitride layer 70 and the top surface of the second insulating layer 25, as illustrated in FIG. 14. According to exemplary embodiments of the invention, the dielectric layer 80 may be formed of aluminum oxide ($Al_2O_3$), tantalum oxide, ($Ta_2O_5$), zirconium oxide ($ZrO_2$), hafnium oxide (HfO), a hafnium-aluminum-oxygen alloy (Hf—Al—O), or a lanthanum-aluminum-oxygen alloy (La—Al—O), among others. Although the details for the formation of the dielectric layer 80 will be described below with reference to an aluminum oxide ($Al_2O_3$) dielectric layer 80, it must be understood that this embodiment is only exemplary and the invention is not limited to it.

The $Al_2O_3$ dielectric layer 80 may be formed by a deposition technique, for example chemical vapor deposition (CVD), metalorganic chemical vapor deposition (MOCVD) or sputtering, among others, to a thickness of about 20 Angstroms to about 500 Angstroms, more preferably of about 25 Angstroms to about 100 Angstroms.

In yet another exemplary embodiment of the present invention, the $Al_2O_3$ dielectric layer 80 is formed by an atomic layer deposition (ALD) technique. According to this embodiment, a first species of aluminum precursor, such as an aluminum source precursor containing chlorine (Cl), for example $AlCl_4$ (aluminum tertachloride) or $AlCl_3$ (aluminum trichloride), is first deposited over the surface of the first metal nitride layer 70 (FIG. 13) and the second insulating layer 25 as a first monolayer. A second species of oxygen precursor, which may be an oxygen ($O_2$) or an ozone ($O_3$) source, for example, is next applied over the monolayer of the first species of precursor. The second species of precursor reacts with the monolayer of the first species of precursor to form an aluminum oxide ($Al_2O_3$) layer.

Each of the $Al_2O_3$ layers of the first and second species of precursors are provided on the surface of the first metal nitride layer 70 and over the upper surface of the second insulating layer 25 by first pulsing the first species (also called first precursor gas) and then the second species (also called second precursor gas) into the region of the surface of the first metal nitride layer 70 and of the second insulating layer 25. The sequence of depositing the monolayers of the first and second species of precursors can be repeated cycle after cycle and as often as needed, until a desired thickness is reached for the $Al_2O_3$ dielectric layer 80. Between each of the precursor gas pulses, the process region is exhausted and a pulse of purge gas is injected. In any event, the thickness of the $Al_2O_3$ dielectric layer 80 formed by the ALD process outlined above is in the range of about 10 Angstroms to about 100 Angstroms, more preferably of about 25 Angstroms to about 50 Angstroms.

Figure 15:
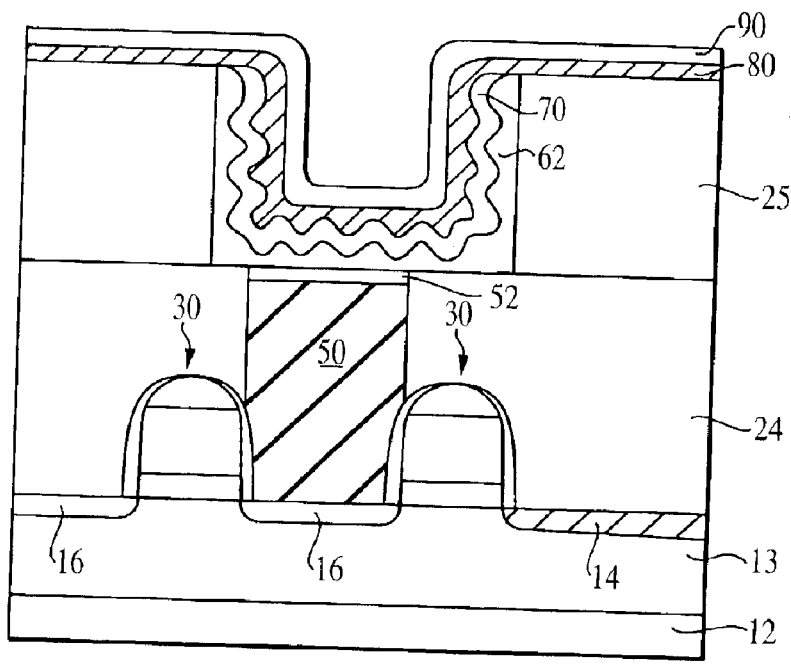
FIG. 15 is a schematic cross-sectional view of the FIG. 1 device at a stage of processing subsequent to that shown in FIG. 14.
Figure 16:
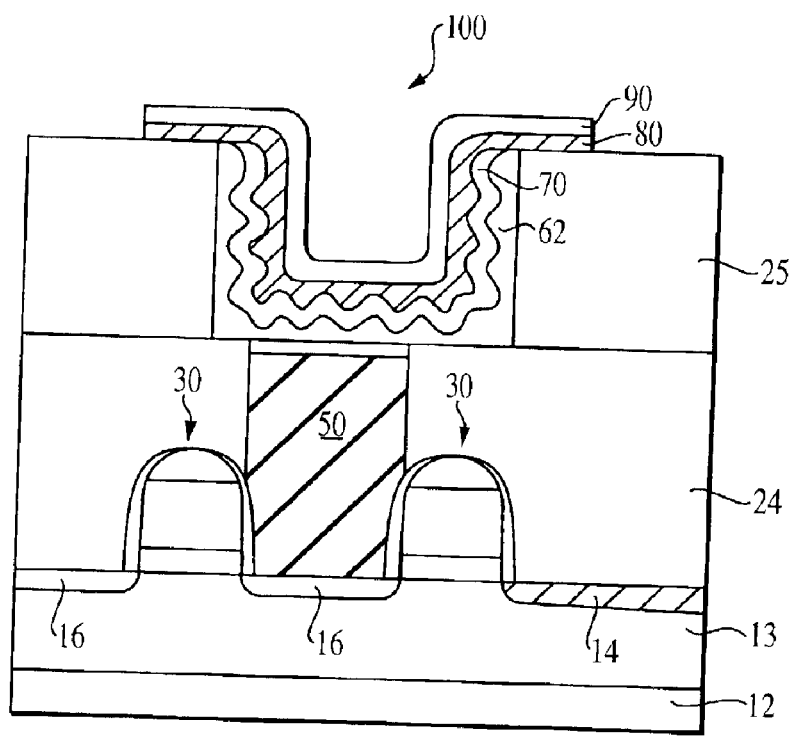
FIG. 16 is a schematic cross-sectional view of the FIG. 1 device at a stage of processing subsequent to that shown in FIG. 15.

Referring now to FIG. 15, a second metal nitride layer 90 is formed as an upper capacitor electrode 90 to complete the formation of the MIM capacitor 100 (FIG. 16). The second metal nitride layer 90 is formed over the $Al_2O_3$ dielectric layer 80 to a thickness of about 25 Angstroms to about 1,000 Angstroms, more preferably of about 50 Angstroms to about 250 Angstroms.

According to an embodiment of the present invention, the second metal nitride layer 90 (FIG. 15) is formed of titanium nitride (TiN) material. The titanium nitride layer 90 may be formed by a chemical vapor deposition (CVD) process using a metal source and a nitrogen source as precursors, at a temperature of about 500° C. to about 800° C., more preferably of about 600° C. For example, the titanium nitride layer 90 may be formed using a nitrogen source, such as an ammonia ($NH_3$) source, and a titanium source precursor containing chlorine (Cl), such as $TiCl_4$ (titanium tetrachloride), $TiCl_3$ (titanium trichloride), $(C_5H_5)_2TiCl_2$ [bis(cyclopentadienyl)titanium dichloride] or $(C_5H_5)TiCl_3$ (cyclopentadienyltitanium trichloride), among others. Alternatively, the titanium nitride layer 90 may be formed by a low-temperature chemical vapor deposition (CVD) process by adding $(CH_3)HNNH_2$ (methylhydrazine) to a titanium source containing chlorine (Cl), for example $TiCl_4$ (titanium tetrachloride). A metalorganic precursor such as $TiN[CH_2(CH_3)_2]_4$ (tetrakis diethylamino titanium or TDEAT) or $Ti[N(CH_3)_2]_4$ (tetrakis dimethylamino titanium or TDMAT) may be also used with a nitrogen source precursor to form the titanium nitride layer 90 of FIG. 15.

According to yet another embodiment of the present invention, the titanium nitride layer 90 (FIG. 15) may be formed by an atomic layer deposition (ALD) process. Because the ALD process takes place at low temperatures, the formation of the upper electrode 90 at the low ALD temperatures mitigates degradation of the $Al_2O_3$ dielectric layer 80 (FIG. 14) during the ALD processing steps. The low ALD temperatures also prevent the formation of oxygen vacancies in the aluminum oxide material which typically occur as a result of high processing temperatures.

If ALD processing is employed, a first species of precursor, which may be a titanium source precursor containing chlorine (Cl), such as $TiCl_4$ (titanium tetrachloride) or $TiCl_3$ (titanium trichloride), for example, is first deposited over the initial surface of the $Al_2O_3$ dielectric layer 80 (FIG. 14) as a first monolayer. A second species of precursor, which may be an ammonia ($NH_3$) source, for example, is next applied over the monolayer of the first species of precursor. The second species of precursor reacts with the monolayer of the first species of precursor to form a titanium nitride (TiN) layer. Each of the TiN layers of the first and second species of precursors are provided on the surface of the $Al_2O_3$ dielectric layer 80 by first pulsing the first species and then the second species into the region of the surface of the $Al_2O_3$ dielectric layer 80. As explained above, the sequence of depositing the monolayers of the first and second species of precursors can be repeated cycle after cycle and as often as needed, until a desired thickness is reached for the titanium nitride (TiN) layer 90. Preferably, the thickness of the titanium nitride layer 90 formed by the ALD process outlined above is in the range of about 10 Angstroms to about 250 Angstroms, more preferably of about 25 Angstroms to about 50 Angstroms.

According to an embodiment of the present invention, the second metal nitride layer 90 is formed of boron-doped titanium nitride (TiBN) material having a boron doping concentration of from about 0.01% to about 30% (atomic percentage). Incorporation of boron into a titanium nitride (TiN) film may be achieved by exposing a titanium nitride film to $B_2H_6$ at a temperature of from about 200° C. to about 600° C., a pressure of from about 1 Torr to about 1000 Torr, and for a period of time of about 10 seconds to about 60 minutes to convert the titanium nitride film to the boron-doped titanium nitride layer 90 (FIG. 15). Alternatively, the incorporation of boron into a titanium nitride (TiN) film may be achieved by exposing the titanium nitride film to $B_2H_6$ and further to ultraviolet (UV) light, at a temperature of from about 200° C. to about 600° C., a pressure of from about 1 Torr to about 1000 Torr, and for a period of time of about 10 seconds to about 60 minutes. The boron-doped titanium nitride layer 90 may be also formed by a deposition method, for example, a chemical vapor deposition (CVD) process using a titanium source, a boron source, and a nitrogen source as precursors, at a temperature of about 500° C. to about 800° C., more preferably of about 600° C. This way, the boron-doped titanium nitride layer 90 may be formed using a titanium source precursor containing chlorine (Cl), such as for example $TiCl_4$ (titanium tetrachloride), $TiCl_3$ (titanium trichloride), $(C_5H_5)_2TiCl_2$ [bis(cyclopentadienyl) titanium dichloride] or $(C_5H_5)TiCl_3$ (cyclopentadienyltitanium trichloride), a boron source such as $B_2H_6$, and a nitrogen source, such as an ammonia ($NH_3$) source.

FIG. 16 illustrates the $Al_2O_3$ dielectric layer 80 and the second metal nitride layer 90 patterned, by a dry etch process, for example, and the complete formation of the MIM capacitor 100 having lower and upper capacitor electrodes 70, 90 formed of either titanium nitride or boron-doped titanium nitride material. To this end, further well-known processing steps to create a functional memory cell containing the MIM capacitor 100 may now be carried out.

Figure 17:
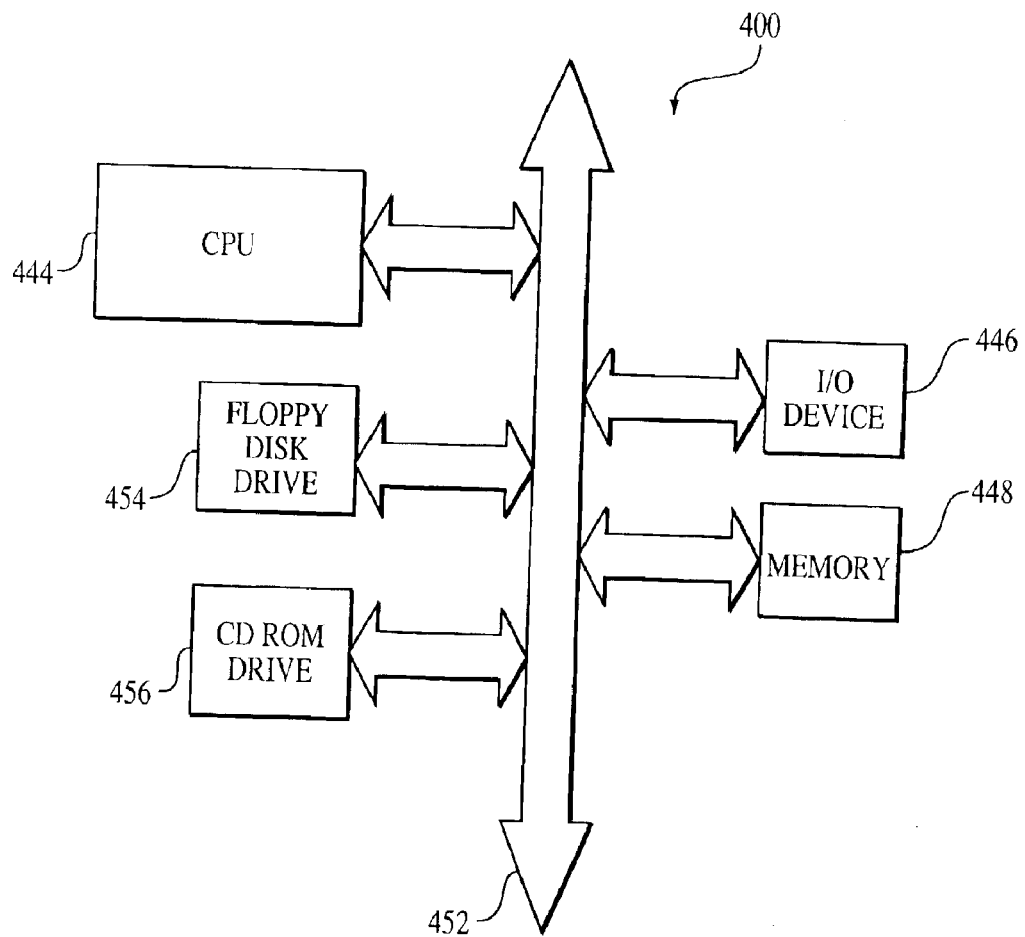
FIG. 17 is an illustration of a computer system having a memory device with an MIM capacitor constructed in accordance with the present invention.

A typical processor system 400 is illustrated in FIG. 17. The processor-based system 400 includes a memory circuit 448, for example a DRAM memory circuit or a memory module containing one or more DRAM memory devices, at least one having at least one MIM capacitor, such as the MIM capacitor 100 (FIG. 16) formed in accordance with the present invention. A processor system, which may be a computer system, generally comprises a central processing unit (CPU) 444, such as a microprocessor, a digital signal processor, or other programmable digital logic devices, which communicates with an input/output (I/O) device 446 over a bus 452. The memory 448 communicates with the processor over bus 452 directly or though a memory controller.

Examples of the implementation of the present invention will now be described with reference to FIGS. 18–19. In each of the four sets of experiments which will be described in more detail below, the leakage currents of four MIM capacitors fabricated according to methods of the present invention were measured and recorded. More specifically, four sets of measurements were run for four different MIM capacitors fabricated according to various embodiments of the present invention, and the data from each set of measurements was recorded and illustrated in FIGS. 18 and 19.

First Set of Experiments

Under a first set of experiments, a first MIM capacitor was formed on a semiconductor wafer according to a first embodiment of the present invention. The first MIM capacitor was fabricated with a lower electrode of CVD boron-doped titanium nitride of about 100 Angstroms thick, an ALD $Al_2O_3$ dielectric layer of about 50 Angstroms thick, and an upper electrode of ALD titanium nitride of about 100 Angstroms thick.

The boron-doped titanium nitride lower electrode was formed by a chemical vapor deposition (CVD) process using a $TiCl_4$ (titanium tetrachloride) source precursor, a $B_2H_6$ boron source and an ammonia ($NH_3$) source, at a temperature of about 600° C. Subsequent to its formation, the boron-doped titanium nitride lower electrode of the first MIM capacitor was subjected to an RPN treatment at a temperature of about 600° C. in the presence of nitrogen ($N_2$) plasma for about 60 seconds. Following the CMP processing and removal of the photoresist material described above with reference to FIGS. 11-13, the boron-doped titanium nitride lower electrode of the first MIM capacitor was again subjected to a second RPN treatment, at a temperature of about 600° C. in the presence of nitrogen ($N_2$) plasma for about 60 seconds. The ALD $Al_2O_3$ dielectric layer of the first MIM capacitor was formed by atomic layer deposition using TMA (trimethylaluminum) as an aluminum source precursor and ozone ($O_3$). The titanium nitride upper electrode was also formed by atomic layer deposition, employing $TiCl_4$ (titanium tetrachloride) as a first source precursor and ammonia ($NH_3$) as a second source precursor.

A first group of measurements for the capacitance and leakage current of the first MIM capacitor described above was conducted from various die locations across the wafer. The capacitance measurements were conducted at 1 kHz and zero (0) bias, and the corresponding leakage current measurements were conducted at 1.5 V DC bias and at about 85° C. The distribution of the leakage current vs. capacitance measurements for the first MIM capacitor was recorded as region A in FIG. 18. The distribution of the leakage current across the first group of measurements for the first MIM capacitor was recorded in FIG. 19 as line A1.

Figure 18:
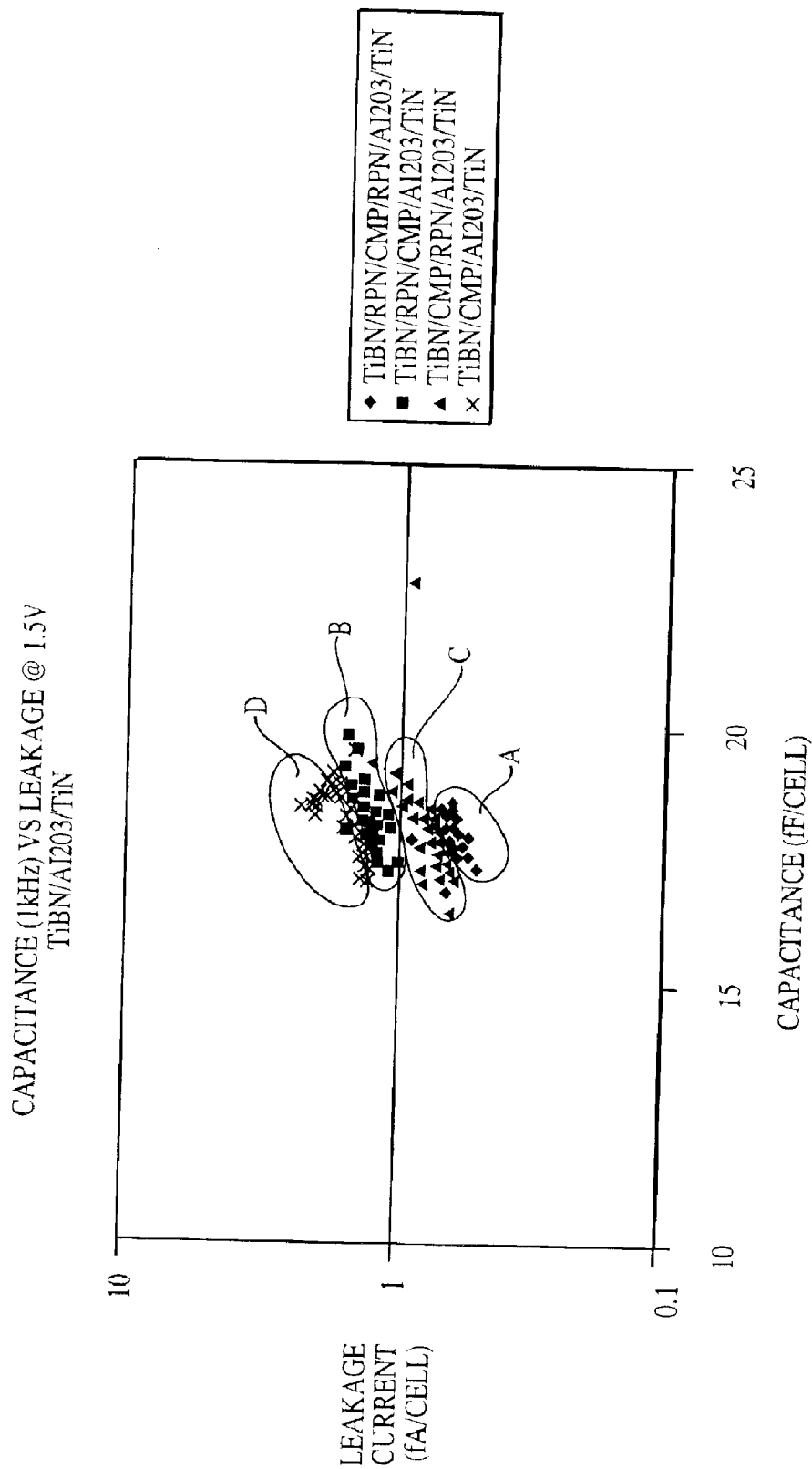
FIG. 18 is a graph illustrating data measurements for the leakage current and capacitance of four MIM capacitors fabricated according to embodiments of the present invention.
Figure 19:
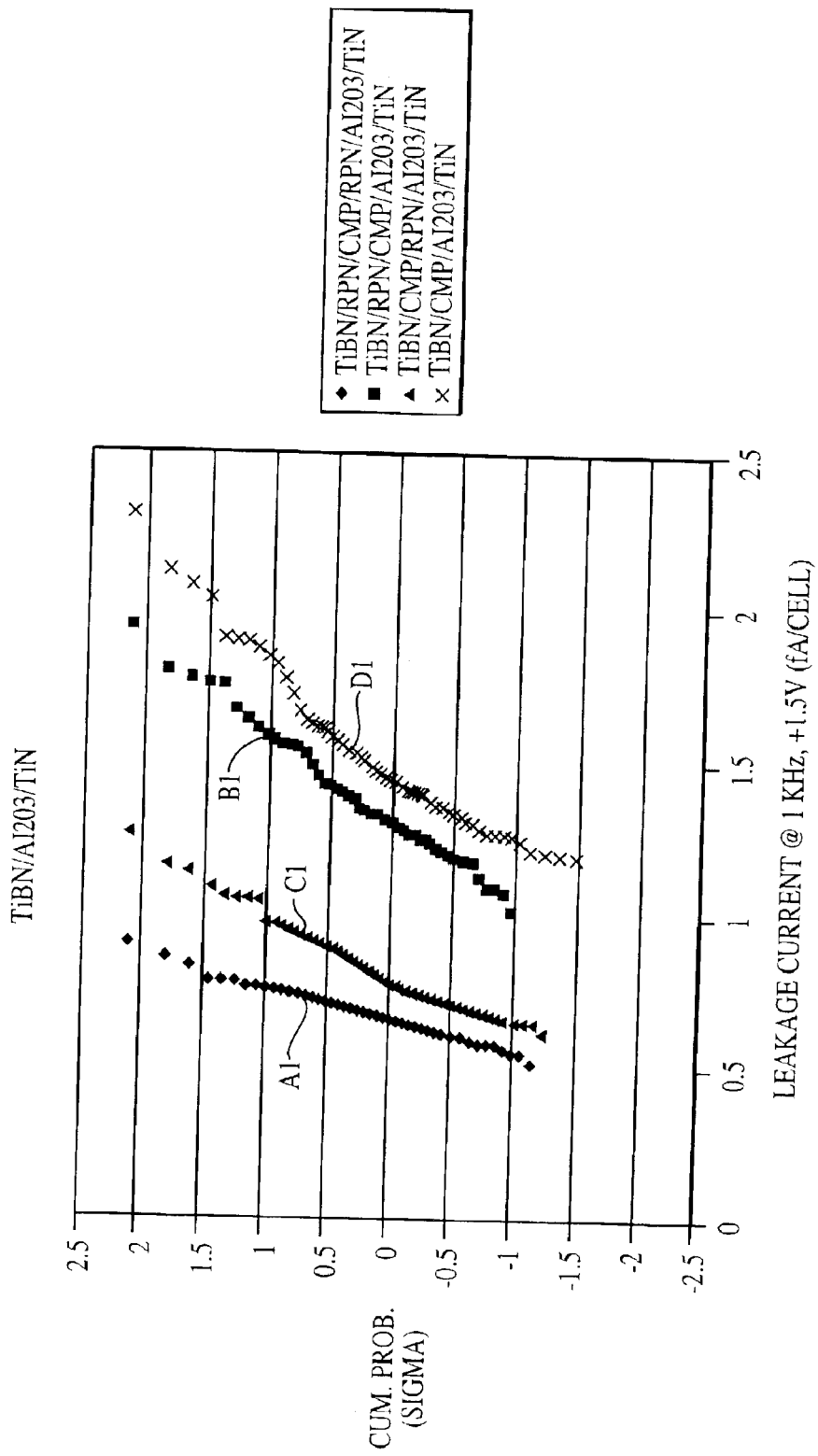
FIG. 19 is a graph illustrating the distribution of the leakage current for each group of measurements corresponding to the four MIM capacitors fabricated according to the present invention.
Figure 3:
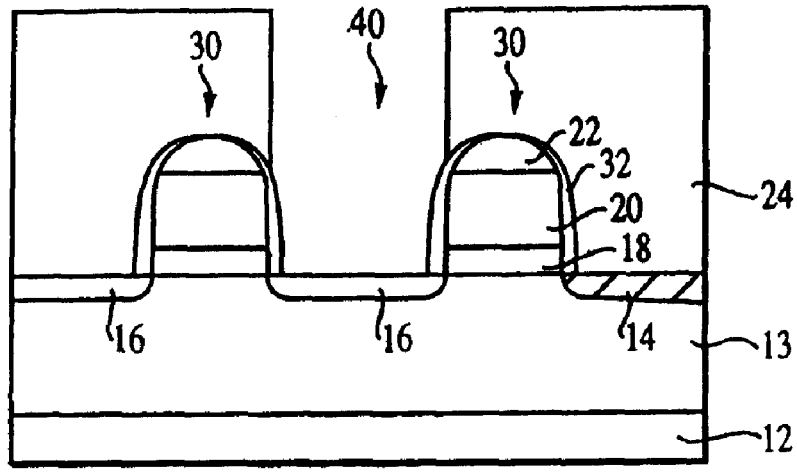
Figure 4:
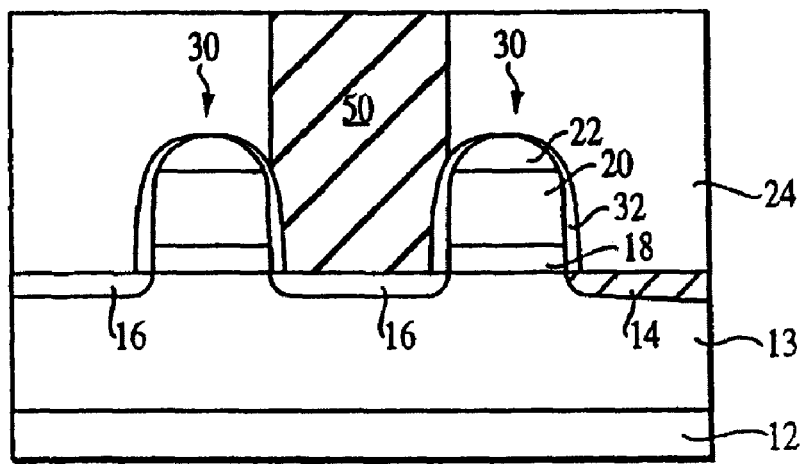

As illustrated in FIG. 18, for capacitance values of about 16 to 20 fF corresponding to the region A, the leakage current values are within 0.4 to 0.8 fA. The leakage current values corresponding to region A of FIG. 18 are also exemplified by line A1 of FIG. 19.

Second Set of Experiment

Under a second set of experiments, a second MIM capacitor was formed on a semiconductor wafer according to a second embodiment of the present invention. The second MIM capacitor was fabricated with a lower electrode of CVD boron-doped titanium nitride of about 100 Angstroms thick, an ALD $Al_2O_3$ dielectric layer of about 50 Angstroms thick, and an upper electrode of ALD titanium nitride of about 100 Angstroms thick.

The boron-doped titanium nitride lower electrode was formed by a chemical vapor deposition (CVD) process using a TiCl$_4$ (titanium tetrachloride) source precursor, a B$_2$H$_6$ boron source and an ammonia (NH$_3$) source, at a temperature of about 600° C. Subsequent to its formation, the boron-doped titanium nitride lower electrode of the first MIM capacitor was subjected to an RPN treatment at a temperature of about 600° C. in the presence of nitrogen plasma for about 60 seconds. CMP processing and removal of the photoresist material, as described above with reference to FIGS. 11–13, followed the RPN treatment, without an additional RPN treatment. The ALD Al$_2$O$_3$ dielectric layer of the second MIM capacitor was formed by atomic layer deposition using TMA (trimethylaluminum) as an aluminum source precursor and ozone (O$_3$). The titanium nitride upper electrode was also formed by atomic layer deposition, employing TiCl$_4$ (titanium tetrachloride) as a first source precursor and ammonia (NH$_3$) as a second source precursor.

A second group of measurements for the capacitance and leakage current of the second MIM capacitor described above was conducted from various die locations across the wafer. The capacitance measurements were conducted at 1 kHz and zero (0) bias, and the corresponding leakage current measurements were conducted at 1.5 V DC bias and at about 85° C. The distribution of the leakage current vs. capacitance measurements for the second MIM capacitor was recorded as region B in FIG. 18. The distribution of the leakage current across the second group of measurements for the second MIM capacitor was recorded in FIG. 19 as line B1.

As illustrated in FIG. 18, for capacitance values of about 16 to 20 fF corresponding to the region B, the leakage current values are within 1.0 to 1.8 fA. The leakage current values corresponding to region B of FIG. 18 are also exemplified by line B1 of FIG. 19.

Third Set of Experiments

Under a third set of experiments, a third MIM capacitor was formed on a semiconductor wafer according to a third embodiment of the present invention. The third MIM capacitor was fabricated with a lower electrode of CVD boron-doped titanium nitride of about 100 Angstroms thick, an ALD Al$_2$O$_3$ dielectric layer of about 50 Angstroms thick, and an upper electrode of ALD titanium nitride of about 100 Angstroms thick.

The boron-doped titanium nitride lower electrode was formed by a chemical vapor deposition (CVD) process using a TiCl$_4$ (titanium tetrachloride) source precursor, a B$_2$H$_6$ boron source and an ammonia (NH$_3$) source, at a temperature of about 600° C. Subsequent to its formation, the boron-doped titanium nitride lower electrode of the third MIM capacitor was not subjected to an RPN treatment, as explained above with reference to the formation of the boron-doped titanium nitride lower electrodes of the first and second MIM capacitors. Rather, the RPN treatment took place only after the CMP processing and removal of the photoresist material, described above with reference to FIGS. 11–13. The RPN treatment was conducted at a temperature of about 600° C. in the presence of nitrogen plasma for about 60 seconds. The ALD Al$_2$O$_3$ dielectric layer of the third MIM capacitor was formed after the CMP processing and removal of the photoresist material, by atomic layer deposition using TMA (trimethylaluminum) as an aluminum source precursor and ozone. The titanium nitride upper electrode was also formed by atomic layer deposition, employing TiCl$_4$ (titanium tetrachloride) as a first source precursor and ammonia (NH$_3$) as a second source precursor.

A third group of measurements for the capacitance and leakage current of the third MIM capacitor described above was conducted from various die locations across the wafer. The capacitance measurements were conducted at 1 kHz and zero (0) bias, and the corresponding leakage current measurements were conducted at 1.5 V DC bias and at about 85° C. The distribution of the leakage current vs. capacitance measurements for the third MIM capacitor was recorded as region C in FIG. 18. The distribution of the leakage current across the third group of measurements for the third MIM capacitor was recorded in FIG. 19 as line C1.

As illustrated in FIG. 18, for capacitance values of about 16 to 20 fF corresponding to the region C, the leakage current values are within 0.6 to 1.1 fA. The leakage current values corresponding to region C of FIG. 18 are also exemplified by line C1 of FIG. 19.

Fourth Set of Experiments

Under a fourth set of experiments, a fourth MIM capacitor was formed on a semiconductor wafer according to a fourth embodiment of the present invention. The fourth MIM capacitor was fabricated with a lower electrode of CVD deposited boron-doped titanium nitride of about 100 Angstroms thick, an ALD Al$_2$O$_3$ dielectric layer of about 50 Angstroms thick, and an upper electrode of ALD titanium nitride of about 100 Angstroms thick.

The boron-doped titanium nitride lower electrode was formed by a chemical vapor deposition (CVD) process using a TiCl$_4$ (titanium tetrachloride) source precursor, a B$_2$H$_6$ boron source and an ammonia (NH$_3$) source at a temperature of about 600° C. Subsequent to its formation, the boron-doped titanium nitride lower electrode of the fourth MIM capacitor was subjected only to CMP processing and removal of the photoresist material, without any RPN treatments. The ALD Al$_2$O$_3$ dielectric layer of the fourth MIM capacitor was formed by atomic layer deposition using TMA (trimethylaluminum) as an aluminum source precursor and ozone. The titanium nitride upper electrode was also formed by atomic layer deposition, employing TiCl$_4$ (titanium tetrachloride) as a first source precursor and ammonia (NH$_3$) as a second source precursor.

A fourth group of measurements for the capacitance and leakage current of the fourth MIM capacitor described above was conducted from various die locations across the wafer. The capacitance measurements were conducted at 1 kHz and zero (0) bias, and the corresponding leakage current measurements were conducted at 1.5 V DC bias and at about 85° C. The distribution of the leakage current vs. capacitance measurements for the fourth MIM capacitor was recorded as region D in FIG. 18. The distribution of the leakage current across the fourth group of measurements for the fourth MIM capacitor was recorded in FIG. 19 as line D1.

As illustrated in FIG. 18, for capacitance values of about 16 to 20 fF corresponding to the region D, the leakage current values are within 1.1 to 2.2 fA. The leakage current values corresponding to region D of FIG. 18 for the fourth MIM capacitor are also exemplified by line D1 of FIG. 19.

The results of the four sets of experiments detailed above show that the leakage current of an MIM capacitor fabricated according to various embodiments of the present invention is substantially decreased when the lower electrode is subjected to an RPN treatment after the CMP processing and removal of the photoresist material. This is exemplified by lines A1 and C1 of FIG. 19, according to which the leakage current values for the first and third MIM capacitors fall between 0.4 to 0.8 fA (line A1 for the first MIM capacitor) and between 0.6 to 1.1 fA (line C1 for the third MIM capacitor).

The results of the four sets of experiments also demonstrate that subjecting the boron-doped titanium nitride lower electrode to an additional RPN treatment before the CMP processing and removal of the photoresist material further decreases the leakage current. FIGS. 18 and 19 shown that the values of the leakage current of the first MIM capacitor, which has the boron-doped titanium nitride lower electrode subjected to two RPN treatments, are lower than the values of the leakage current of the third MIM capacitor, which has the boron-doped titanium nitride lower electrode subjected to only one RPN treatment. The values of the leakage current for the first MIM capacitor, which fall between 0.4 to 0.8 fA (line A1 of FIG. 19), are lower that the values of the leakage current for the third MIM capacitor, which fall between 0.6 to 1.1 fA (line C1 of FIG. 19).

Although the exemplary embodiments of the present invention have been described with reference to the formation of one MIM capacitor 100 (FIG. 16), the invention also contemplates the formation of a plurality of such capacitors, as desired. In addition, the invention contemplates the fabrication of an MIM capacitor, such as the MIM capacitor 100 of FIG. 16, on an integrated circuit substrate which may include other capacitor structures, for example, conventional container capacitors, MIS or SIS capacitors.

Accordingly, the above description and drawings are only to be considered illustrative of exemplary embodiments which achieve the features and advantages of the present invention. Modification and substitutions to specific process conditions and structures can be made without departing from the spirit and scope of the present invention. Thus, the invention is not to be considered as being limited by the foregoing description and drawings, but is only limited by the scope of the appended claims.

What is claimed as new and desired to be protected by Letters Patent of the United States is:

1. A method of forming an MIM capacitor on a semiconductor substrate, comprising the acts of:
   providing a conductive support layer over a polysilicon plug formed over a substrate;
   providing a first metal nitride layer over said conductive support layer;
   providing a dielectric layer over said first metal nitride layer and in contact with said conductive support layer; and
   providing a second metal nitride layer over said dielectric layer, wherein each of said first and second metal nitride layers is formed of titanium nitride or boron-doped titanium nitride material.

2. The method of claim 1, wherein each of said first and second metal nitride layers is a titanium nitride layer.

3. The method of claim 1, wherein said conductive support layer is a layer of hemispherical grained polysilicon adjacent said first metal nitride layer.

4. The method of claim 3 further comprising the act of opening grains forming said layer of hemispherical grained polysilicon, to activate said grains.

5. The method of claim 4, wherein said act of opening said grains further comprising etching said layer of hemispherical grained polysilicon to form an etched layer of hemispherical grained polysilicon.

6. The method of claim 5, wherein said act of etching said layer of hemispherical grained polysilicon further comprises contacting said layer of hemispherical grained polysilicon with a solution of HF.

7. The method of claim 3 further comprising the act of subjecting said layer of hemispherical grained polysilicon to an RTN process.

8. The method of claim 3 further comprising the act of subjecting said layer of hemispherical grained polysilicon to an anneal process.

9. The method of claim 3 further comprising the act of subjecting said layer of hemispherical grained polysilicon to a $PH_3$ anneal.

10. The method of claim 1, wherein said first metal nitride layer is a titanium nitride layer formed by chemical vapor deposition.

11. The method of claim 10, wherein said titanium nitride layer is formed by chemical vapor deposition using a nitrogen source and a titanium source precursor.

12. The method of claim 11, wherein said titanium source precursor is selected from the group consisting of titanium tetrachloride, titanium trichloride, bis(cyclopentadienyl) titanium dichloride and cyclopentadienyltitanium trichloride.

13. The method of claim 1, wherein said first metal nitride layer is a titanium nitride layer formed by atomic layer deposition.

14. The method of claim 13, wherein said titanium nitride layer is formed by atomic layer deposition using a nitrogen source and a titanium source precursor.

15. The method of claim 14, wherein said titanium source precursor is selected from the group consisting of titanium tetrachloride, titanium trichloride, bis(cyclopentadienyl) titanium dichloride and cyclopentadienyltitanium trichloride.

16. The method of claim 1 further comprising the act of subjecting said first metal nitride layer to a nitridizing ambient.

17. The method of claim 16, wherein said act of subjecting said first metal nitride layer to a nitridizing ambient further comprising the act of exposing said first metal nitride layer to a nitrogen-containing plasma at a temperature from about 500° C. to about 900° C.

18. The method of claim 1 further comprising the act of subjecting said first metal nitride layer to an oxidizing ambient.

19. The method of claim 18, wherein said act of subjecting said first metal nitride layer to an oxidizing ambient further comprising the act of exposing said first metal nitride layer to a remote oxygen-containing plasma.

20. The method of claim 1, wherein said dielectric layer is an aluminum oxide layer.

21. The method of claim 20, wherein said aluminum oxide layer is formed by atomic layer deposition.

22. The method of claim 21, wherein said aluminum oxide layer is formed by atomic layer deposition using an oxygen source and an aluminum source precursor.

23. The method of claim 22, wherein said aluminum source precursor is aluminum tetrachloride or aluminum trichloride.

24. The method of claim 1, wherein said second metal nitride layer is a titanium nitride layer formed by chemical vapor deposition.

25. The method of claim 24, wherein said titanium nitride layer is formed by chemical vapor deposition using a nitrogen source and a titanium source precursor.

26. The method of claim 25, wherein said titanium source precursor is selected from the group consisting of titanium tetrachloride, titanium trichloride, bis(cyclopentadienyl) titanium dichloride and cyclopentadienyltitanium trichloride.

27. The method of claim 1, wherein said second metal nitride layer is a titanium nitride layer formed by atomic layer deposition.

28. The method of claim 27, wherein said titanium nitride layer is formed by atomic layer deposition using a nitrogen source and a titanium source precursor.

29. The method of claim 28, wherein said titanium source precursor is selected from the group consisting of titanium tetrachloride, titanium trichloride, bis(cyclopentadienyl) titanium dichloride and cyclopentadienyltitanium trichloride.

30. A method of forming an MIM capacitor on a semiconductor substrate, comprising the acts of:
providing a first metal nitride layer over a substrate;
providing a dielectric layer over said first metal nitride layer; and
providing a second metal nitride layer over said dielectric layer, wherein each of said first and second metal nitride layers is a boron-doped titanium nitride layer.

31. A method of forming an MIM capacitor on a semiconductor substrate, comprising the acts of:
providing a first metal nitride layer over a substrate;
providing a dielectric layer over said first metal nitride layer; and
providing a second metal nitride layer over said dielectric layer, wherein said first metal nitride layer is a titanium nitride layer and said second metal nitride layer is a boron-doped titanium nitride layer.

32. A method of forming an MIM capacitor on a semiconductor substrate, comprising the acts of:
providing a first metal nitride layer over a substrate;
providing a dielectric layer over said first metal nitride layer; and
providing a second metal nitride layer over said dielectric layer, wherein said first metal nitride layer is a boron-doped titanium nitride layer and said second metal nitride layer is a titanium nitride layer.

33. A method of forming an MIM capacitor on a semiconductor substrate, comprising the acts of:
providing a first metal nitride layer over a substrate wherein said first metal nitride layer is a boron-doped titanium nitride layer formed by chemical vapor deposition;
providing a dielectric layer over said first metal nitride layer; and
providing a second metal nitride layer over said dielectric layer.

34. The method of claim 33, wherein said act of providing said boron-doped titanium nitride layer further comprises the act of incorporating boron into a titanium nitride layer.

35. The method of claim 34, wherein said act of incorporating boron into a titanium nitride layer further comprises the act of exposing said titanium nitride layer to $B_2H_6$.

36. The method of claim 35, wherein said act of incorporating boron into a titanium nitride layer further comprises the act of exposing said titanium nitride layer to $B_2H_6$ at a temperature of about 200° C. to about 600° C.

37. The method of claim 35 further comprising the act of exposing said titanium nitride layer and $B_2H_6$ to ultraviolet light.

38. A method of forming an MIM capacitor on a semiconductor substrate, comprising the acts of:
providing a first metal nitride layer over a substrate;
providing a dielectric layer over said first metal nitride layer; and
providing a second metal nitride layer over said dielectric layer, wherein said second metal nitride layer is a boron-doped titanium nitride layer formed by chemical vapor deposition.

39. The method of claim 38, wherein said act of providing said boron-doped titanium nitride layer further comprises the act of incorporating boron into a titanium nitride layer.

40. The method of claim 39, wherein said act of incorporating boron into a titanium nitride layer further comprises the act of exposing said titanium nitride layer to $B_2H_6$.

41. The method of claim 40, wherein said act of incorporating boron into a titanium nitride layer further comprises the act of exposing said titanium nitride layer to $B_2H_6$ at a temperature of about 200° C. to about 600° C.

42. The method of claim 40 further comprising the act of exposing said titanium nitride layer and $B_2H_6$ to ultraviolet light.

43. A method of forming an aluminum oxide MIM capacitor on a semiconductor substrate, comprising the acts of:
providing a layer of hemispherical grained polysilicon over a semiconductor substrate;
etching said layer of hemispherical grained polysilicon to form an etched layer of hemispherical grained polysilicon;
forming a lower capacitor electrode of titanium nitride or boron-doped titanium nitride material over said etched layer of hemispherical grained polysilicon;
forming an aluminum oxide dielectric layer by atomic layer deposition in contact with said lower capacitor electrode; and
forming an upper capacitor electrode of titanium nitride or boron-doped titanium nitride material in contact with said aluminum oxide dielectric layer.

44. The method of claim 43, wherein each of said lower and upper electrodes is a titanium nitride layer formed by atomic layer deposition.

45. The method of claim 44, wherein said titanium nitride layer is formed by atomic layer deposition using a nitrogen source and a titanium source precursor.

46. The method of claim 45, wherein said titanium source precursor is selected from the group consisting of titanium tetrachloride, titanium trichloride, bis(cyclopentadienyl) titanium dichloride and cyclopentadienyltitanium trichloride.

47. The method of claim 43, wherein said act of etching said layer of hemispherical grained polysilicon further comprises contacting said layer of hemispherical grained polysilicon with a solution of HF.

48. The method of claim 47 further comprising the act of subjecting said layer of hemispherical grained polysilicon to an RTN process.

49. The method of claim 48 further comprising the act of subjecting said layer of hemispherical grained polysilicon to an anneal process.

50. The method of claim 49 further comprising the act of subjecting said layer of hemispherical grained polysilicon to a $PH_3$ anneal.

51. A method of forming an aluminum oxide MIM capacitor on a semiconductor substrate, comprising the acts of:
forming a lower capacitor electrode over said semiconductor substrate;
forming an aluminum oxide dielectric layer by atomic layer deposition over said lower capacitor electrode; and forming an upper capacitor electrode over said aluminum oxide dielectric layer, wherein each of said lower and upper electrodes is a boron-doped titanium nitride layer formed by chemical vapor deposition.

52. A method of forming an aluminum oxide MIM capacitor on a semiconductor substrate, comprising the acts of:

forming a lower capacitor electrode over said semiconductor substrate;

forming an aluminum oxide dielectric layer by atomic layer deposition over said lower capacitor electrode; and forming an upper capacitor electrode over said aluminum oxide dielectric layer, wherein each of said lower and upper electrodes is a boron-doped titanium nitride layer formed by incorporating boron into a titanium nitride layer.

53. The method of claim 52, wherein said act of incorporating boron into said titanium nitride layer further comprises the act of exposing said titanium nitride layer to $B_2H_6$.

54. The method of claim 53, wherein said act of incorporating boron into a titanium nitride layer further comprises the act of exposing said titanium nitride layer to $B_2H_6$ at a temperature of about 200° C. to about 600° C.

55. The method of claim 54 further comprising the act of exposing said titanium nitride layer and $B_2H_6$ to ultraviolet light.

* * * * *

UNITED STATES PATENT AND TRADEMARK OFFICE
CERTIFICATE OF CORRECTION

PATENT NO.     : 6,881,642 B2
DATED          : April 19, 2005
INVENTOR(S)    : Cem Basceri et al.

It is certified that error appears in the above-identified patent and that said Letters Patent is hereby corrected as shown below:

Title page,
Item [56], References Cited, U.S. PATENT DOCUMENTS,
"6,291,342 B1" should read -- 6,291,342 B2 --.

Drawings,
Figs. 3 and 4 should be replaced with attached Sheet 2 of 11.

Column 12,
Line 61, "Experiment" should read -- Experiments --.

Signed and Sealed this

Twentieth Day of December, 2005

JON W. DUDAS
*Director of the United States Patent and Trademark Office*